United States Patent
Tong et al.

(10) Patent No.: US 7,093,560 B2
(45) Date of Patent: Aug. 22, 2006

(54) TECHNIQUES FOR REDUCING ARCING-RELATED DAMAGE IN A CLAMPING RING OF A PLASMA PROCESSING SYSTEM

(75) Inventors: Jose Tong, Pleasanton, CA (US); Eric H. Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 308 days.

(21) Appl. No.: 10/418,259

(22) Filed: Apr. 16, 2003

(65) Prior Publication Data
US 2003/0198753 A1    Oct. 23, 2003

Related U.S. Application Data

(60) Provisional application No. 60/373,490, filed on Apr. 17, 2002.

(51) Int. Cl.
*C23C 16/00* (2006.01)
*H01L 21/00* (2006.01)

(52) U.S. Cl. ............... 118/723 E; 118/728; 156/345.44; 216/71

(58) Field of Classification Search ............... 118/728, 118/723 E; 156/345.51
See application file for complete search history.

(56) References Cited

U.S. PATENT DOCUMENTS

| 5,292,399 | A | * | 3/1994 | Lee et al. ............... 438/716 |
| 5,573,596 | A | * | 11/1996 | Yin ............... 118/723 E |
| 6,166,898 | A | * | 12/2000 | Lee et al. ............... 361/234 |
| 6,364,957 | B1 | * | 4/2002 | Schneider et al. ........... 118/728 |
| 6,394,026 | B1 | * | 5/2002 | Wicker et al. ........... 156/345.1 |

\* cited by examiner

*Primary Examiner*—Parviz Hassanzadeh
*Assistant Examiner*—Rakesh K Dhingra
(74) *Attorney, Agent, or Firm*—IP Strategy Group, P.C.

(57) ABSTRACT

A clamping ring configured to be coupled to a chamber structure of a plasma processing chamber is disclosed. The clamping ring has a plurality of holes for accommodating a plurality of fasteners. The clamping ring includes a plurality of flanges disposed around an outer periphery of the clamping ring, adjacent flanges of the plurality of flanges being disposed such that a hole of the plurality of holes that is disposed in between the adjacent flanges is about equidistant from the adjacent flanges. The plurality of flanges are configured to mate with the chamber structure. The clamping ring and the flanges are dimensioned such that when the plurality of flanges mate with the chamber structure, recesses between adjacent ones of the plurality of flanges form gaps between the clamping ring and the chamber structure.

9 Claims, 6 Drawing Sheets

US 7,093,560 B2

TECHNIQUES FOR REDUCING ARCING-RELATED DAMAGE IN A CLAMPING RING OF A PLASMA PROCESSING SYSTEM

The present invention claims priority from a commonly assigned U.S. Provisional Application Ser. No. 06/373,490, filed Apr. 17, 2002 entitled "Reduced Dielectric Clamp Insulator Ring" by the same inventors herein and incorporated by reference herein.

BACKGROUND OF THE INVENTION

The present invention relates to methods and apparatus for improving process results while processing a substrate in a plasma processing system.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels.

During processing, multiple deposition and/or etching steps are typically employed. During deposition, materials are deposited onto a substrate surface (such as the surface of a glass panel or a wafer). For example, deposited layers comprising various forms of silicon, silicon dioxide, silicon nitride, metals and the like may be formed on the surface of the substrate. Conversely, etching may be employed to selectively remove materials from predefined areas on the substrate surface. For example, etched features such as vias, contacts, or trenches may be formed in the layers of the substrate. Some etch processes may utilize chemistries and/or parameters that simultaneously etch and deposit films on the plasma-facing surfaces.

The plasma can be generated and/or sustained using a variety of plasma generation methods, including inductively-coupled, ECR, microwave and capacitively-coupled plasma methods. Plasma processing systems differ widely in their configurations, some of which may be more suitable for certain etch processes than others.

Plasma processing systems employing clamping rings have been employed for some time to etch a variety of features in semiconductor substrates. To facilitate discussion, FIG. 1 illustrates a cross-section view of an exemplary plasma processing system 102. Plasma processing system 102 includes a chamber wall 104, which provides an enclosure and defines a processing chamber therein as well as defining an exhaust passageway 106 for exhausting etch byproducts. Chamber wall 104 is grounded in the exemplary plasma processing system of FIG. 1.

An upper electrode 108, which is also electrically grounded in the example of FIG. 1, functions as the etchant source gas distribution mechanism. Etchant source gas is introduced into the chamber via an inlet 112 and is distributed in the plasma region 114 between upper electrode 108 and a substrate 124, which is disposed above a lower electrode 116.

Lower electrode 116 is energized by a RF generator 120, which provides RF power to lower electrode 116 via a match network 122. A V/I probe 126 is shown coupled to match network 122 to measure the voltage and current furnished by RF generator 120 for feedback control purposes. In the example of FIG. 1, RF generator 120 supplies both 2 MHz and 27 MHz RF frequencies to lower electrode 116. When RF generator 120 supplies RF power to lower electrode 116, a plasma is ignited and sustained in the aforementioned plasma region 114 to etch substrate 124.

Lower electrode 116 is secured to chamber wall 104 via a lower electrode securing arrangement that includes O-rings 130A–B, an insulator ring 132, a clamping ring 134, and a set of stainless screws, of which two screws 136 and 138 are shown. Clamping ring 134 is typically formed from an insulator material, such as ceramic, to insulate lower electrode 116 from grounded chamber wall 104. As shown in FIG. 1, clamping ring 134 includes a shoulder 140 that bears against a lip 142 of chamber wall 104 when screw 136 is tightened to pull lower electrode 116 downward toward clamping ring 134. With clamping ring 134 held immobile by lip 142 and shoulder 140, the tightening of screw 136 causes lower electrode 116 to compress O-rings 130A–B against insulator ring 132 and chamber wall 104, thereby forming a tight seal to isolate the chamber interior from the ambient environment.

FIG. 1 also shows an upper focus ring 150 and a lower focus ring 152, which help focus and maintain the plasma in the region above substrate 124 to improve process results. The components of FIG. 1 are conventional and may be found in, for example, the Exelan™ family of plasma etchers, which is available from Lam Research Corporation of Fremont, Calif.

FIG. 2 shows clamping ring 134 in greater detail, including shoulder 140 and a plurality of holes 160 to accommodate the aforementioned screws, such as screw 136 or 138 of FIG. 1.

FIG. 3 shows the lower electrode securing arrangement in greater detail. Screw 136, which is typically formed of stainless steel or another suitable relatively non-reactive high strength material, is disposed in a cavity created within clamping ring 134. Clamping ring 134, which may be formed of for example alumina or another suitable ceramic material, is insulated from screw 136 by a clamping ring sleeve 302, which lines the interior of the clamping ring cavity. Clamping ring sleeve 302 may be formed from a suitable plastic material such as VESPEL, DELRIN, or PEEK, and is provided to help reduce the corona electrical discharge during processing between the high RF voltage surfaces of screw 136 (which is coupled to lower electrode 116) and the grounded surfaces of chamber wall 104.

As shown in FIG. 3, the cavity within clamping ring 134 is counter-bored to accommodate a screw head 144 of screw 136 completely within the body of clamping ring 134 while allowing screw head 144 to bear against clamping ring 134 when screw 136 is tightened against lower electrode 116. Since clamping ring 134 is held immobile by the aforementioned shoulder 140 of clamping ring 134 and lip 142 of chamber wall 104, such tightening of screw 136 forces lower electrode 116 downward, thereby compressing O-rings 130A–B to form a tight seal Even though screw head 144 of screw 136 is completely disposed inside the body of clamping ring 134, the likelihood for discharge from the screw head is further reduced by the use of a clamping ring cap 304, which screws into the threaded portion of clamping ring sleeve 302 to reduce the volume of empty space 146 that exists within the clamping ring cavity.

It has been discovered, however, that clamping ring sleeve 302 and clamping ring cap 304 in the lower electrode securing arrangement of FIG. 3 fail to prevent damaging electrical discharge under certain process conditions. For example, inspection of clamping ring sleeve 302 and clamping ring cap 304 in field-deployed plasma processing systems reveals arching failure, including burning, of certain regions of clamping ring sleeve 302 and clamping ring cap 304. The sleeve regions where the damage tends to be observed are marked in FIG. 3 by reference numbers 310 and 312. These regions are typically adjacent to sharp corners of screw 136, and a close inspection of the damaged sleeve regions suggests that RF energy has been absorbed by the damaged sleeve regions.

While not wishing to be bound by theory, it is believed that the plasma acts as the principal resistive component during processing. When the plasma is extinguished (e.g., due to certain operating conditions that no longer sustain the plasma), the resistive component of the plasma chamber is substantially eliminated and the capacitive component dominates. As power continues to be furnished by the RF generator, little or none is absorbed by the resistive component. This condition in turn causes the RF voltage to increase since the match network of the RF power supply system will attempt to increase the RF voltage to match the power absorption with the amount of power that the RF generator has been asked to provide.

The increased RF voltage in turn increases the strength of the electric field between screw 136 and the grounded surfaces of the chamber wall 104. At some later point in time, the RF generator is turned off, and the electric field strength is reduced. However, during the window of time between the time the plasma is extinguished and the time the RF generator is turned off, a high electric field exists between the screws and grounded surfaces of the chamber wall, causing discharge damage to some regions of the clamping ring sleeve 302 and/or clamping ring cap 304.

As RF energy is absorbed the clamping ring sleeve/cap, the clamping ring sleeve/cap is damaged and begins to lose some of its capacitance and/or insulative qualities. Because of the damage to the clamping ring sleeve, less RF power is delivered to the plasma during subsequent etches. The degree of sleeve/cap damage changes over time, resulting in a change in the amount of power delivered to the plasma over time. This variation in the amount of RF power delivered to the plasma results in inconsistent etches from substrate to substrate, disadvantageously increasing defects and lowering yield.

SUMMARY OF THE INVENTION

The invention relates, in one embodiment, to a clamping ring configured to be coupled to a chamber structure of a plasma processing chamber. The clamping ring has a plurality of holes for accommodating a plurality of fasteners. The clamping ring includes a plurality of flanges disposed around an outer periphery of the clamping ring, adjacent flanges of the plurality of flanges being disposed such that a hole of the plurality of holes that is disposed in between the adjacent flanges is about equidistant from the adjacent flanges. The plurality of flanges are configured to mate with the chamber structure. The clamping ring and the flanges are dimensioned such that when the plurality of flanges mate with the chamber structure, recesses between adjacent ones of the plurality of flanges form gaps between the clamping ring and the chamber structure.

In another embodiment, the invention relates to a method for processing a substrate in a plasma processing chamber. The method includes providing a clamping ring that is coupled to a chamber structure of a plasma processing chamber during the processing. The clamping ring has a plurality of holes for accommodating a plurality of fasteners. The clamping ring includes a plurality of flanges disposed around an outer periphery of the clamping ring, adjacent flanges of the plurality of flanges being disposed such that a hole of the plurality of holes that is disposed in between the adjacent flanges is about equidistant from the adjacent flanges. The plurality of flanges are configured to mate with the chamber structure, the clamping ring and the flanges being dimensioned such that when the plurality of flanges mate with the chamber structure, recesses between adjacent ones of the plurality of flanges form gaps between the clamping ring and the chamber structure. The method further includes energizing the plasma processing chamber with a RF energy source while measuring a phase angle between a RF current and a RF voltage supplied by the RF energy source. The method additionally includes terminating the energizing by the RF energy source if a terminating condition is satisfied. The terminating condition includes a state whereby the phase angle exceeds a certain phase angle threshold.

In yet another embodiment, the invention relates to a plasma processing system having a plasma processing chamber. The plasma processing chamber includes a clamping ring configured to be coupled to a chamber structure of the plasma processing chamber. The clamping ring has a plurality of holes for accommodating a plurality of fasteners. The clamping ring includes a plurality of flanges disposed around an outer periphery of the clamping ring, adjacent flanges of the plurality of flanges being disposed so as to straddle a hole of the plurality of holes. The plurality of flanges are configured to mate with the chamber structure. The clamping ring and the flanges are dimensioned such that when the plurality of flanges mate with the chamber structure, recesses between adjacent ones of the plurality of flanges form gaps between the clamping ring and the chamber structure.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. The features and advantages of the present invention may be better understood with reference to the drawings and discussions that follow.

In accordance with one embodiment of the present invention, arcing-related damage to the clamping ring sleeve and/or cap is advantageously reduced by optimizing the shape of the clamping ring so as to lower the strength of the electric field experienced by the screws. In one embodiment, the clamping ring includes flanges and recesses around its periphery, with the flanges providing the mechanical support function bearing against the aforementioned lip built into the chamber wall. The recesses provide air gaps along electric field lines between the screws and the grounded surfaces of the chamber wall, thereby effectively reducing the electric field strength experienced by the screws. Accordingly, a discharge event is less likely, and the likelihood for arcing-related damage to the clamping ring sleeve and/or cap is advantageously reduced.

Furthermore, there is provided, in accordance with one embodiment of the present invention, a control technique for reducing the window of time between the time the plasma is extinguished and the time the RF power is turned off. As mentioned earlier, the electric field strength between the screws and grounded surfaces of the chamber wall is increased during this window of time. The control technique relies, in one embodiment, on the phase angle information provided by the V/I probe and detects when the phase angle exceeds a certain threshold. If the phase angle exceeds a certain threshold, the control software then turns the RF generator off. Allowance is made, however, for the plasma ignition phase during which the plasma is also absent but it is undesirable to turn off the RF generator in response to the phase angle information provided by the V/I probe.

By rapidly turning off the RF generator after the plasma is extinguished (as opposed to when the plasma is merely absent prior to plasma ignition), the control technique advantageously reduces the time window when the electric field strength between the screws and grounded surfaces of the chamber wall is high, and thereby advantageously reduces the likelihood for arcing-related damage to the clamping ring sleeve and/or cap.

Figure 4A:
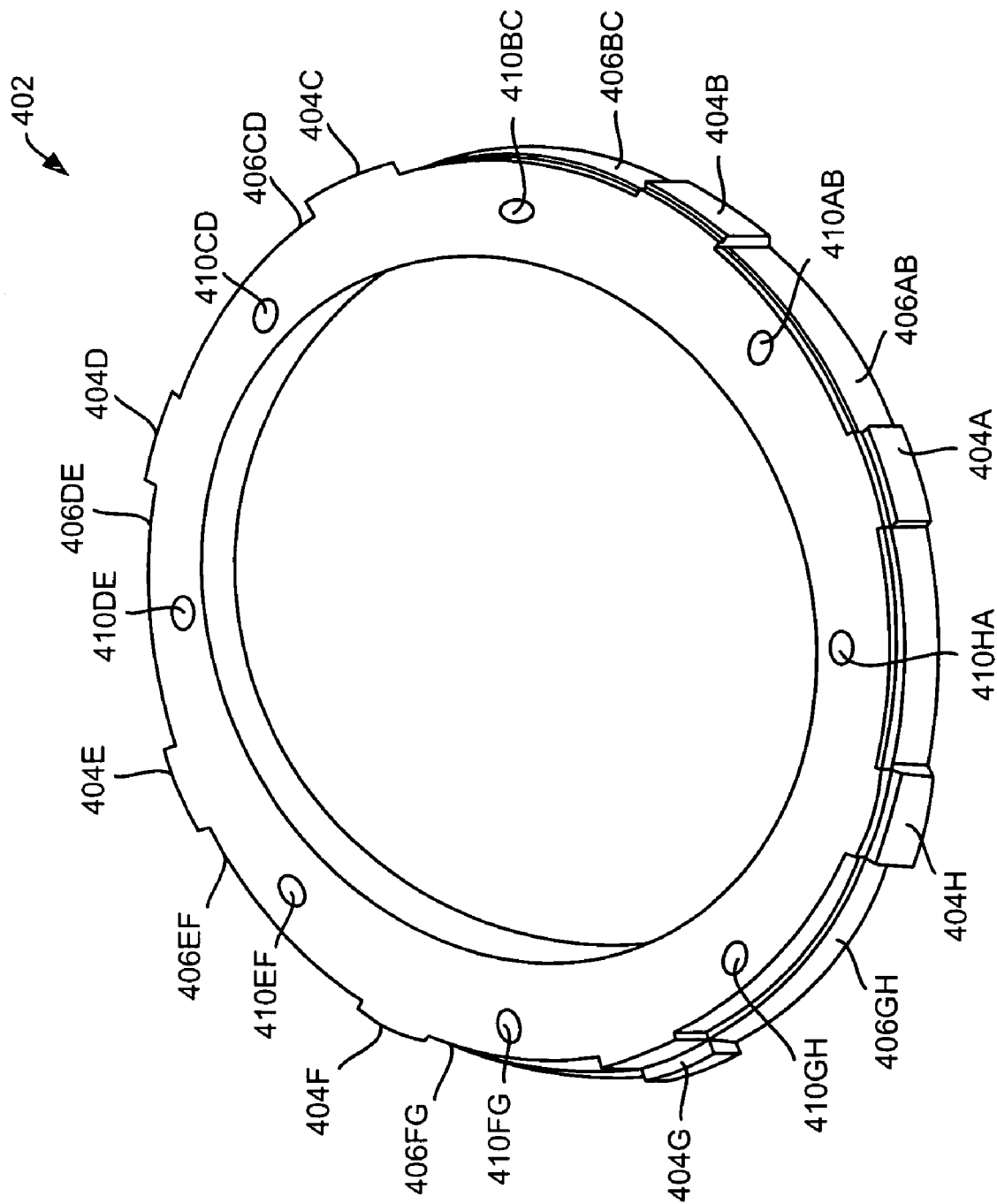
FIG. 4A shows, in accordance with one embodiment of the present invention, a clamping ring having a plurality of flanges.

The features and advantages of the present invention may be better understood with reference to the figures and discussions that follow. FIG. 4A shows, in accordance with one embodiment of the present invention, a clamping ring 402 having eight flanges 404A–404H. Between adjacent flanges, e.g., between flanges 404A and 404B, there is formed a recess region. These recesses are labeled in FIG. 4 as recesses 406AB, 406BC, 406CD, 406DE, 406EF, 406FG, 406GH, and 406HA. For ease of reference, the two letters at the end of each recess label (e.g., the letters "AB" in recess label "406AB") identifies that two flanges adjacent that recess (e.g., flange 404A and 404B in the case of recess label 406AB).

Figure 3:
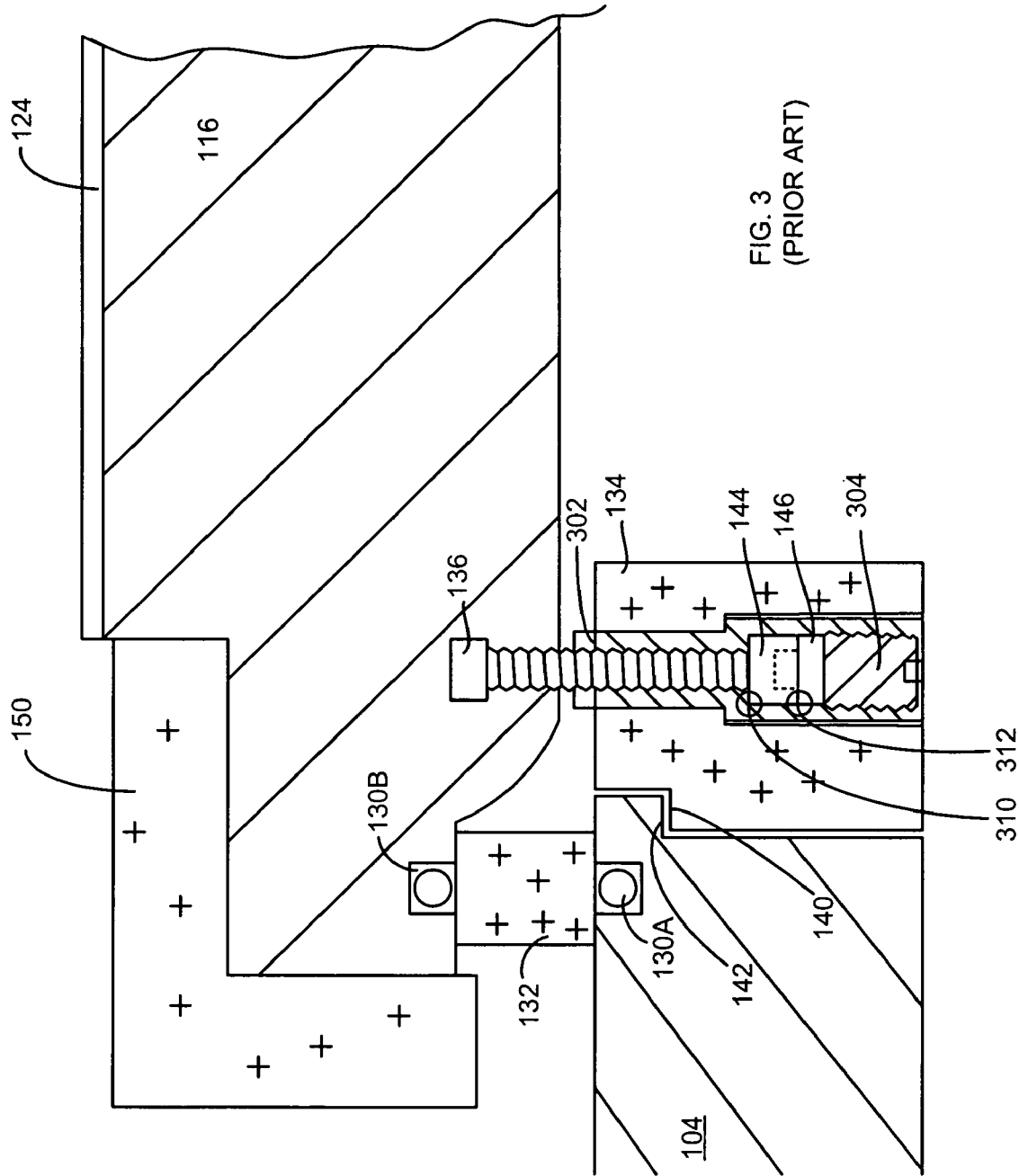
FIG. 3 shows the lower electrode securing arrangement of FIG. 1 in greater detail.

A shoulder is built into each flange to allow the flange shoulder to mate with the lip of the grounded chamber wall (e.g., lip 142 of FIG. 3). The flange shoulder is seen more clearly in FIG. 4B as flange shoulder 408A, which is associated with flange 404A of FIG. 4A. FIG. 4A further shows a plurality of screw holes (8 in the example of FIG. 4A) for accommodating the screws employed to attach clamping ring 402 to the lower electrode (e.g., lower electrode 116 shown in FIG. 3). Each flange is preferably positioned about equidistant from its two adjacent screw holes as the flanges are disposed around the periphery of clamping ring 402 in order to maximize the size of the air gap created by the recess disposed between adjacent flanges and the chamber wall facing such a recess.

With reference to FIG. 4A, screw hole 410AB is preferably positioned about equidistant from its two adjacent flanges 404A and 404B. Likewise, screw hole 410BC is preferably positioned about equidistant from its two adjacent flanges 404B and 404C. This arrangement thus has the effect of maximizing, on average, the size of the air gaps created by recesses 406AB and 406BC with the chamber wall surface facing those recesses. In this manner, the air gap between a screw hole, such as screw hole 410BC, and the grounded chamber wall surface facing screw hole 410BC is also maximized, thereby lowering the electric field experienced by the screws disposed within screw hole 410BC when the screw in screw hole 410BC is at the RF potential of the lower electrode and the chamber wall surface facing recess 406BC is grounded. Other screw holes are similarly positioned with respect to their adjacent flanges around the periphery of clamping ring 402.

Each flange and associated flange shoulder are preferably dimensioned so as to maximize its adjacent air gaps while being able to withstand the force created by the pressure differential between the ambient atmosphere and the vacuum environment within the plasma chamber interior. In one exemplary clamping ring implementation, the clamping ring is formed of alumina. However, other materials such as silicon dioxide, silicon nitride, or a similarly suitable material may also be employed.

In one embodiment, the clamping ring diameter (measured across its bottom, non-chamber-wall-mating surface and exclusive of the flanges) is about 7.5 inches. Each flange has a thickness of about 0.062 inch above its surrounding recesses. Each flange has a width that is approximately 0.35 inch, and a shoulder that is recessed from the circular periphery of the clamping ring by 0.125 inch and recessed from the top surface by about 0.75 inch.

Figure 4B:
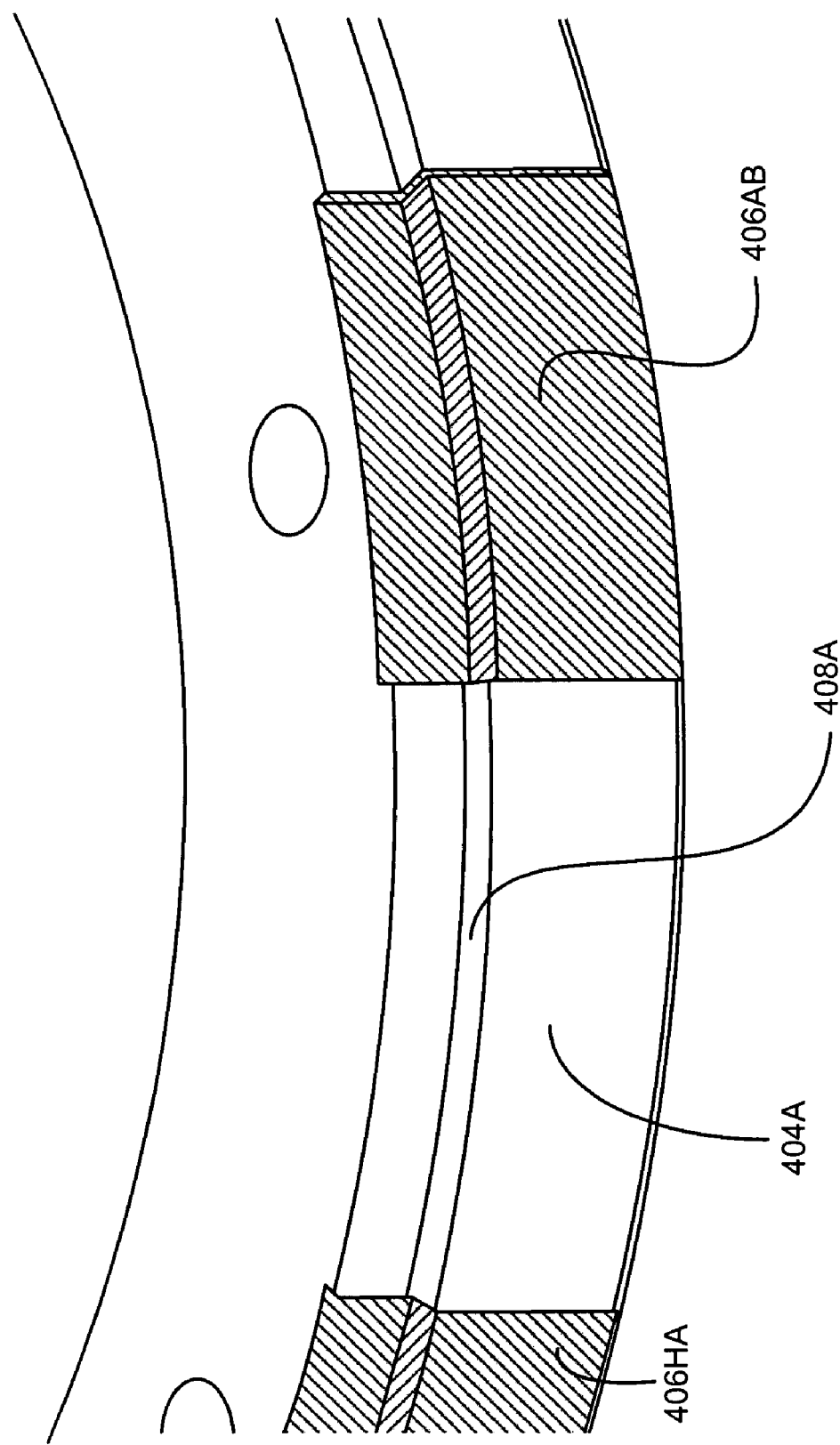
FIG. 4B shows, in accordance with one embodiment of the present invention, the flange shoulder of FIG. 4A in greater detail.

It should be noted that although FIG. 4B shows a shoulder in the recessed region (e.g., recessed region 406HA), such a shoulder may not be necessary since the recessed region does not need to come into contact with the chamber wall. Furthermore, it is possible to omit the shoulder even in the flange, if desired, by allowing the upper edge of flange to bear directly against the lip in the chamber wall. Additionally or alternatively, the chamber wall may have flanges to bear against the clamping ring to create air gaps or to increase the air gaps between the chamber wall and the clamping ring. In these exemplary approaches, the air gap feature is retained to lower the likelihood of discharge damage to the clamping ring sleeve and/or cap.

As mentioned, the air gap created by a recess has the effect of reducing the electric field strength experienced by the screw disposed within the screw hole. This is because the air gap has a substantially lower dielectric constant (e.g., a K value of 1) than the dielectric constant of the clamping ring material it displaces (e.g., a K value of 10 for the alumina clamping ring material). With reference to FIG. 4A, the presence of the air gap associated with recess 406AB has the effect of reducing the electric field strength experienced by the screw disposed within screw hole 410AB when the screw disposed within screw hole 410AB is at the RF voltage potential of the lower electrode (e.g., lower electrode 116 in FIG. 3) and the adjacent chamber wall (e.g., chamber wall 104 in FIG. 3) is grounded. As the electric field strength experienced by the screw is reduced, the tendency to arc is also correspondingly reduced, thereby advantageously reducing the likelihood for arc-related damage to the clamping ring sleeve and/or cap surrounding the screw.

The clamping ring sleeve and clamping ring cap are preferably made of a sufficiently sturdy and insulative material and having a sufficient thickness to withstand, without being damaged, at least the high electric field condition that exists in the time window between the time the plasma is extinguished and the time the RF generator is turned off. In one embodiment, the clamping ring sleeve and/or clamping ring cap (e.g., sleeve 302 and/or cap 304 of FIG. 3) is made of VESPEL, although other materials such as PEEK, Ultem, or Delrin may also be employed.

As an addition to or as an alternative to optimizing the clamping ring in the manner discussed above, there is provided, in accordance with one embodiment of the present invention, a control technique for reducing the window of time between the time the plasma is extinguished and the time the RF power is turned off. Since the time window between the time the plasma is extinguished and the time the RF generator is turned off represents the time period during which the greatest likelihood for clamping ring sleeve/cap arcing-related damage exists, it is advantageous to keep this time window as small as possible.

As an aside, it should be understood that it is extremely difficult to completely eliminate the aforementioned time window. A time window of some finite duration is unavoidable due to, in part, the delay between the time the plasma extinguished condition is detected and the time the RF power can be turned off. For example, a finite amount of time is required to detect the plasma extinguished condition, to generate a control signal responsive to the detection of the plasma extinguished condition, to transmit the control signal to the control software, to receive a definitive control signal from the control software that the RF power needs to be turned off, to transmit the definitive software-generated control signal to the RF generator, and to have the RF power actually turned off by the control circuitry of the RF generator.

The control technique relies, in one embodiment, on the phase angle information provided by the V/I probe and detects when the phase angle exceeds a certain threshold. If the phase angle exceeds a certain threshold, the control software issues the control signal to turn the RF generator off. Further, the control technique intelligently distinguishes between the plasma extinguished condition and the plasma ignition phase, during which plasma is also absent but it is undesirable to turn off the RF generator in response to the phase angle information provided by the V/I probe.

Figure 1:
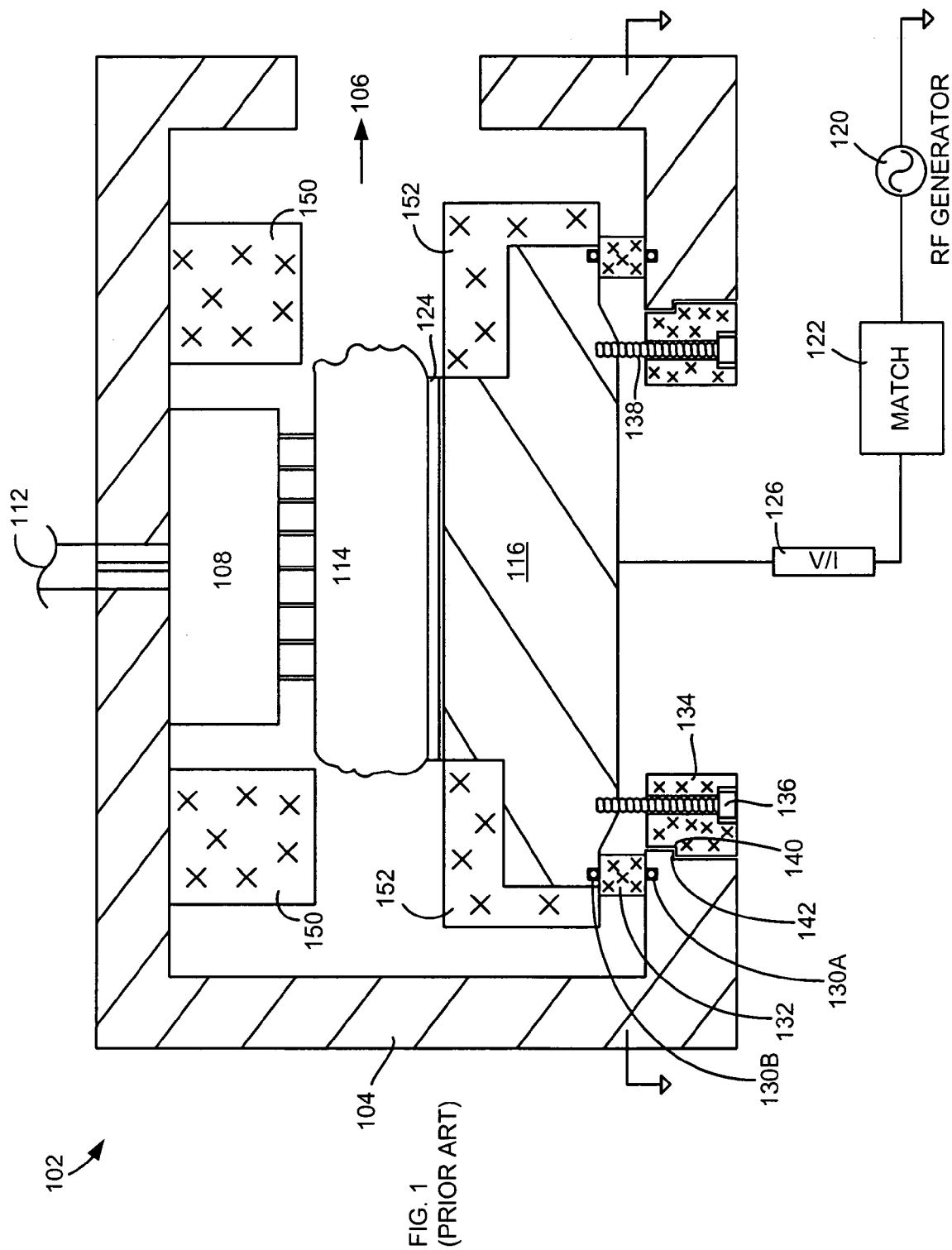
FIG. 1 illustrates a cross-section view of a prior art plasma processing system.
Figure 2:
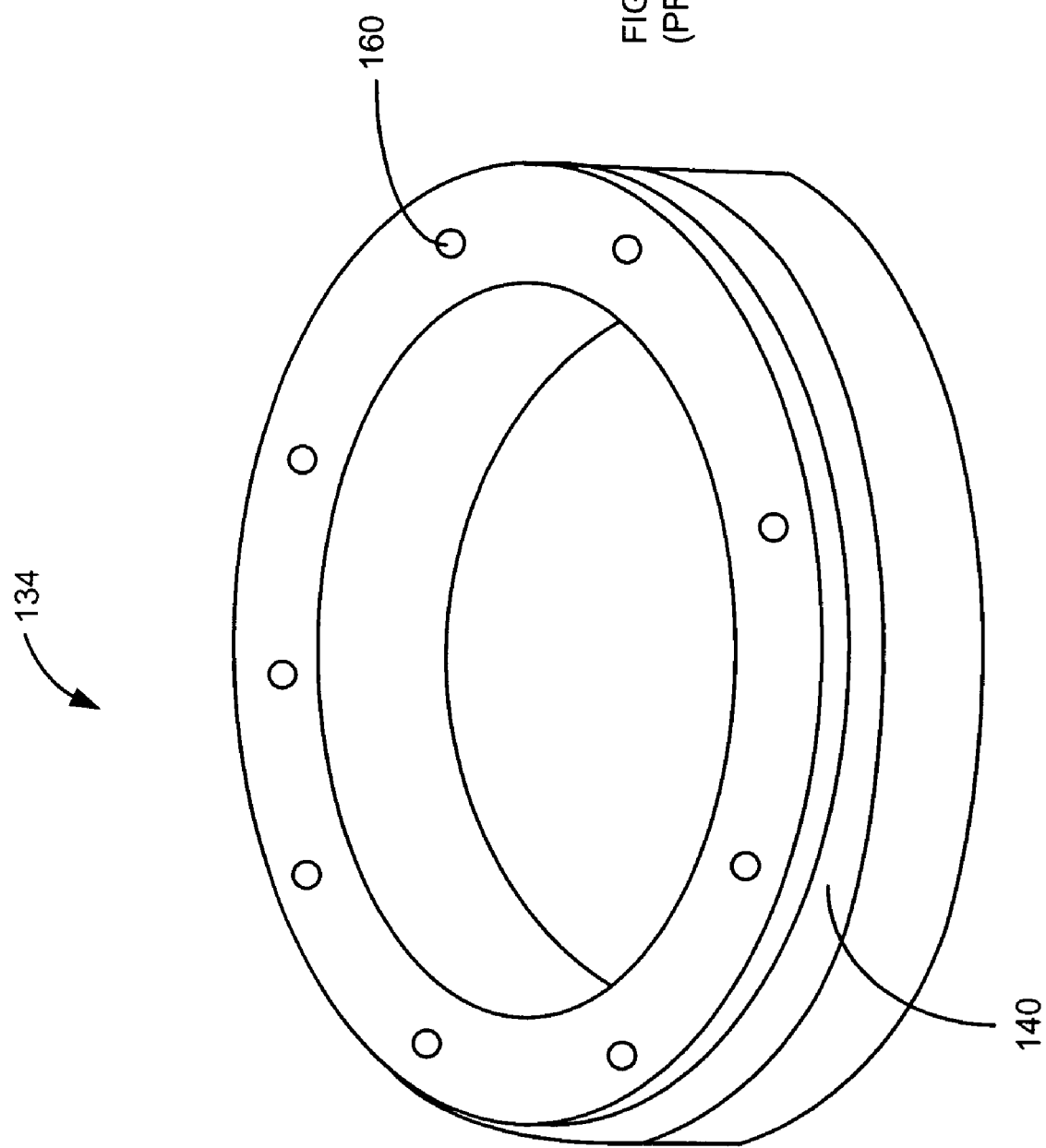
FIG. 2 shows the clamping ring of FIG. 1 in greater detail.
Figure 5:
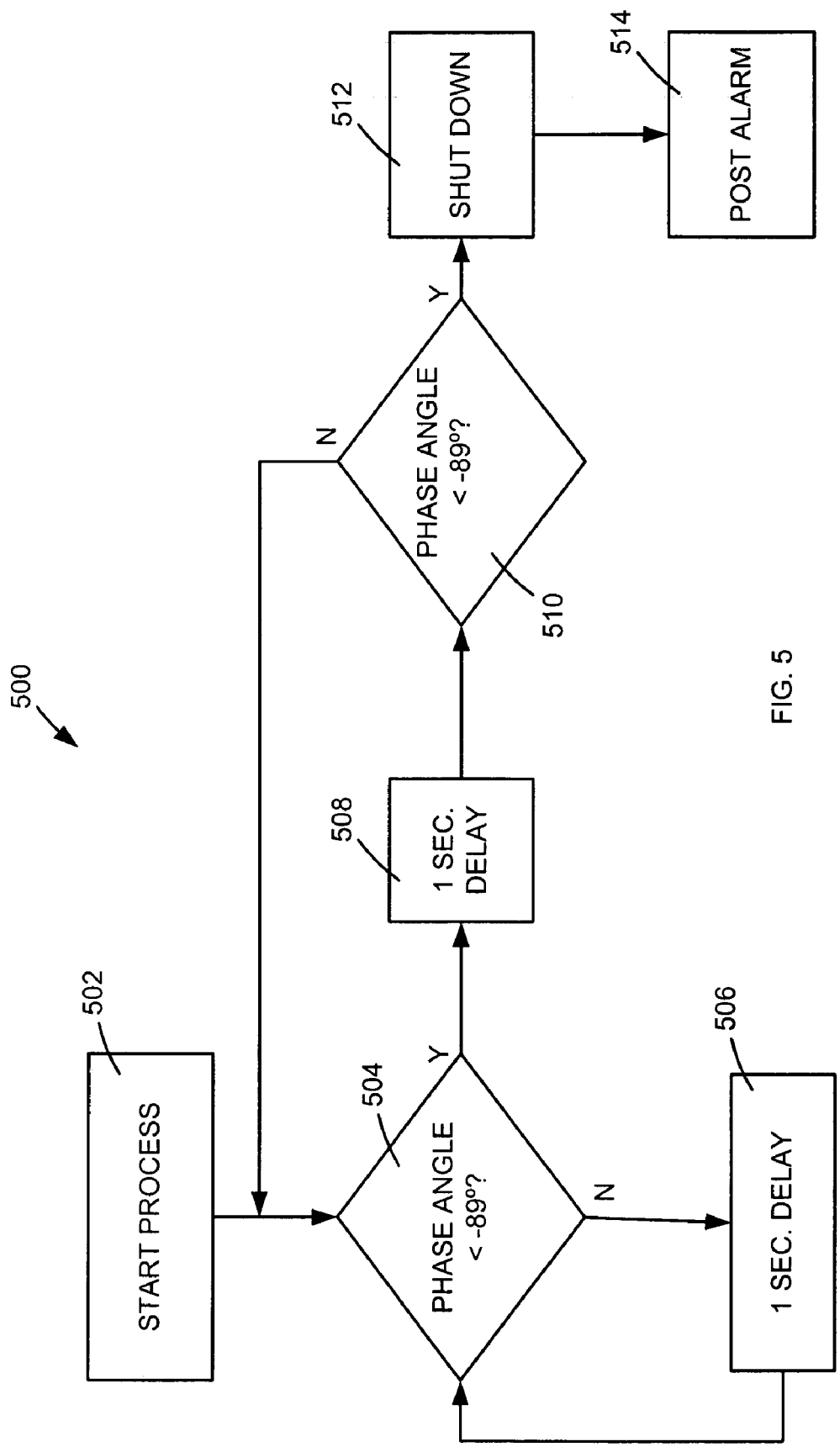
FIG. 5 shows, in accordance with a preferred embodiment of the present invention, a control technique for reducing the time window between the time the plasma is extinguished and the time the RF power is turned off.

FIG. 5 shows, in accordance with a preferred embodiment of the present invention, a control technique 500 for reducing the time window between the time the plasma is extinguished and the time the RF power is turned off. Block 502 represents the start of the etch cycle. During etching, the V/I probe (e.g., V/I probe 126 shown in FIG. 1) monitors the voltage and current supplied by the RF generator. The phase angle shift between the voltage and current measured by the V/I probe is then ascertained.

In block 504, it is ascertained whether the phase angle exceeds a certain threshold. For the aforementioned Exelan™ plasma processing chamber, the threshold is exceed when the phase angle is less than −89 degrees. If the phase angle is not less than −89 degrees (as ascertained in block 504), a one second delay is imposed (block 506), and the technique returns to block 504 thereafter to continue monitoring the phase angle.

On the other hand, if the phase angle is less than −89 degrees (as ascertained in block 504), another one-second delay is imposed (block 508). The goal is to distinguish between the situation wherein the phase angle remains at less than −89 degrees for longer than about 2 seconds from the situation wherein the phase angle is at less than −89 degrees for less than about 2 seconds.

In the former case, i.e., the phase angle remains at less than −89 degrees for longer than about 2 seconds, the plasma is assumed to be extinguished, and the RF power needs to be turned off. In the latter case, i.e., the phase angle is at less than −89 degrees for less than about 2 seconds, it is assumed that the system is in the plasma ignition phase, and the control signal to turn the RF power off is not generated. Given this goal, it should be understood that other ways of implementing the goal besides the exact steps and sequence of blocks 504, 506, 508, and 510 are also possible.

In block 510, if the phase angle remains at less than −89 degrees after the one-second delay of block 508, the technique proceeds to block 512 to issue the control signal to the RF generator to shut off the RF power. In block 514, an alarm indicating the plasma extinguished condition is posted. On the other hand, if the phase angle is not less than −89 degrees after the one-second delay of block 508 (as determined by block 510), the technique returns to block 504 to continue monitoring the phase angle.

As mentioned, by rapidly turning off the RF generator after the plasma is extinguished (as opposed to when the plasma is merely absent prior to plasma ignition), the control technique advantageously reduces the time window when the electric field strength between the screws and grounded surfaces of the chamber wall is high, and further reduces the likelihood for arcing-related damage to the clamping ring sleeve and/or cap.

While this invention has been described in terms of several preferred embodiments, there are alterations, permutations, and equivalents which fall within the scope of this invention. For example, there are 8 screws (and flanges) in the exemplary clamping ring, any suitable number of screws (and flanges) may be employed. Furthermore, although the threshold for detecting the plasma extinguished condition is −89 degrees in phase angle, this threshold may vary from system to system and may be empirically determined in different systems. Likewise, although a two-second delay is employed as the time delay to distinguish between a plasma ignition phase and a plasma extinguished condition, this value may vary from system to system and may also be empirically determined. As a further example, although the clamping ring of the exemplary embodiments is shown coupled to the chamber wall, it may be coupled to other chamber structure if such is desired. As yet another example, although screws are mentioned as exemplary fasteners to fasten the exemplary clamping ring in place, other fasteners such as bolts, hooks, cam-operated devices, spring-operated devices, and the like may also be employed to hold the clamping ring in place. It should also be noted that there are many alternative ways of implementing the apparatuses of the present invention. It is therefore intended that the following appended claims be interpreted as including all such alterations, permutations, and equivalents as fall within the true spirit and scope of the present invention.

What is claimed is:

1. A clamping ring configured to be coupled to a chamber structure of a plasma processing chamber, said clamping ring having a plurality of holes for accommodating a plurality of fasteners, said clamping ring comprising:

a plurality of flanges disposed around an outer periphery of said clamping ring, adjacent flanges of said plurality of flanges being disposed such that each hole of said plurality of holes that is disposed in between said adjacent flanges is about equidistant from said adjacent flanges, said plurality of flanges being configured to mate with an opening disposed in a bottom chamber wall of said chamber structure, said clamp ring being disposed outside of said plasma processing chamber, said clamping ring and said flanges being dimensioned such that when said plurality of flanges mate with said chamber structure, recesses between adjacent ones of said plurality of flanges form gaps between said clamping ring and said chamber structure, wherein said plurality of fasteners is configured to couple said clamping ring with said bottom chamber wall and an internal lower electrode of said plasma processing chamber.

2. The clamping ring of claim 1 wherein said chamber structure is configured to be at a ground potential level and said clamping ring is configured to be at a RF potential level different from said ground potential level during a processing cycle in said plasma processing chamber.

3. The clamping ring of claim 2 wherein said plurality of flanges include a plurality of shoulder structures, each of said plurality of shoulder structures being configured to mate with a lip formed in said bottom chamber wall.

4. The clamping ring of claim 2 that is formed from one of alumina, silicon dioxide, and silicon nitride.

5. A plasma processing system having a plasma processing chamber, said plasma processing chamber including a clamping ring configured to be coupled to a chamber structure of said plasma processing chamber, said clamping ring having a plurality of holes for accommodating a plurality of fasteners, said clamping ring comprising:

a plurality of flanges disposed around an outer periphery of said clamping ring, adjacent flanges of said plurality of flanges being disposed so as to straddle each hole of said plurality of holes, said plurality of flanges being configured to mate with an opening disposed in a bottom chamber wall of said chamber structure, said clamp ring being disposed outside of said plasma processing chamber, said clamping ring and said flanges being dimensioned such that when said plurality of flanges mate with said chamber structure, recesses between adjacent ones of said plurality of flanges form gaps between said clamping ring and said chamber structure, wherein said plurality of fasteners is configured to couple said clamping ring with said bottom chamber wall and an internal lower electrode of said plasma processing chamber.

6. The plasma processing system of claim 5 wherein said chamber structure is configured to be at a ground potential level and said clamping ring is configured to be at a RF potential level different from said ground potential level during a processing cycle in said plasma processing chamber.

7. The plasma processing system of claim 6 wherein said plurality of flanges of said clamping ring include a plurality of shoulder structures, each of said plurality of shoulder structures being configured to mate with a lip formed in said chamber wall.

8. The plasma processing system of claim 6 wherein said clamping ring is formed from one of alumina, silicon dioxide, and silicon nitride.

9. The plasma processing system of claim 5 wherein said adjacent flanges of said plurality of flanges is further disposed such that said hole of said plurality of holes that is disposed in between said adjacent flanges is about equidistant from said adjacent flanges.

* * * * *